United States Patent
Loke et al.

(10) Patent No.: US 10,418,981 B2
(45) Date of Patent: Sep. 17, 2019

(54) SYSTEM AND METHOD FOR CALIBRATING PULSE WIDTH AND DELAY

(71) Applicant: Samsung Electronics Co., Ltd., Suwon-si, Gyeonggi-do (KR)

(72) Inventors: Wing-Fai Loke, San Jose, CA (US); Chih-Wei Yao, Sunnyvale, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 15/636,387

(22) Filed: Jun. 28, 2017

(65) Prior Publication Data

US 2018/0302069 A1 Oct. 18, 2018

Related U.S. Application Data

(60) Provisional application No. 62/484,846, filed on Apr. 12, 2017.

(51) Int. Cl.
*H03K 5/06* (2006.01)
*H02M 3/07* (2006.01)
(Continued)

(52) U.S. Cl.
CPC ............... *H03K 5/06* (2013.01); *H02M 3/07* (2013.01); *H03K 5/24* (2013.01); *H03K 2005/00019* (2013.01)

(58) Field of Classification Search
CPC ............ H02M 3/04; H02M 3/06; H02M 3/07; H03K 5/04; H03K 5/06; H03K 5/14; H03K 5/24; H03K 2005/00019
See application file for complete search history.

(56) References Cited

U.S. PATENT DOCUMENTS 4,535,242 A * 8/1985 Dirkse .................... G01T 1/17
250/363.02
9,059,685 B2 6/2015 Tseng et al.
(Continued)

FOREIGN PATENT DOCUMENTS

KR 10-0551070 2/2006
KR 10-2010-0053799 5/2010

OTHER PUBLICATIONS

Gao, Xiang et al., "A Low Noise Sub-Sampling PLL in Which Divider Noise is Eliminated and PD/CP Noise is not Multiplied by $N^2$," IEEE Journal of Solid-State Circuits, vol. 44, No. 12, Dec. 2009, pp. 3253-3263.

*Primary Examiner* — Lincoln D Donovan
*Assistant Examiner* — Diana J. Cheng
(74) *Attorney, Agent, or Firm* — Lewis Roca Rothgerber Christie LLP

(57) ABSTRACT

A system and method for calibrating a duration of a pulse or a delay. A reference clock signal includes a sequence of reference pulses, and controls a switch in a first charge pump that is configured to charge a first capacitor. Each of a sequence of test pulses controls a switch in a second charge pump that is configured to charge a second capacitor. At the end of each charging cycle, the respective capacitor voltages are compared and the duration of the test pulses is adjusted, by a feedback circuit, in a direction tending to make the capacitor voltages equal. When the capacitor voltages are equal, the ratio of the lengths of the reference pulses and test pulses equals the ratio of the capacitances, if the charge pumps deliver the same current when switched on.

20 Claims, 12 Drawing Sheets

(51) Int. Cl.
*H03K 5/24* (2006.01)
*H03K 5/00* (2006.01)

(56) References Cited

U.S. PATENT DOCUMENTS

| | | |
|---|---|---|
| 9,310,240 B2 | 4/2016 | Kuwano et al. |
| 9,397,648 B1 | 7/2016 | Elran et al. |
| 2004/0080349 A1* | 4/2004 | Kawahito ............... H03L 7/07 327/158 |
| 2006/0119405 A1 | 6/2006 | Kobayashi |
| 2009/0219003 A1* | 9/2009 | Yang ............... H02M 3/33592 323/283 |
| 2017/0025952 A1 | 1/2017 | Huang |

* cited by examiner

SYSTEM AND METHOD FOR CALIBRATING PULSE WIDTH AND DELAY

CROSS-REFERENCE TO RELATED APPLICATION(S)

The present application claims priority to and the benefit of U.S. Provisional Application No. 62/484,846, filed Apr. 12, 2017, entitled "SYSTEM AND METHOD FOR CALIBRATING PULSE WIDTH AND DELAY", the entire content of which is incorporated herein by reference.

FIELD

One or more aspects of embodiments according to the present disclosure relate to a system and method for calibrating a pulse width and/or a delay.

BACKGROUND

In various applications, delays and/or pulse widths in a circuit may affect performance or behavior of a circuit, and variation in delays or pulse widths as a result of temperature, supply voltage, and process variations may result in circuit characteristics that are not reliably within specification for a circuit, or that result in performance that is inferior to the performance of which the circuit is capable.

SUMMARY

Aspects of embodiments of the present disclosure are directed toward a system and method for calibrating a duration of a pulse or a delay. A reference clock signal includes a sequence of reference pulses, and controls a switch in a first charge pump that is configured to charge a first capacitor. Each of a sequence of test pulses controls a switch in a second charge pump that is configured to charge a second capacitor. At the end of each charging cycle, the respective capacitor voltages are compared and the duration of the test pulses is adjusted, by a feedback circuit, in a direction tending to make the capacitor voltages equal. When the capacitor voltages are equal, the ratio of the lengths of the reference pulses and test pulses equals the ratio of the capacitances, if the charge pumps deliver the same current when switched on.

According to an embodiment of the present invention there is provided a system for calibrating, the system including: a first charge pump having a control input and a current output and being configured to: receive a sequence of reference pulses at the control input; and source or sink a current at the current output during each of the reference pulses; a first capacitor, connected to the current output of the first charge pump and configured to be charged to a reference voltage during each of the reference pulses; a first pulse generator having a pulse width control input, and being configured to generate a sequence of test pulses, each of the test pulses having a duration controlled by a signal received at the pulse width control input; a second charge pump having a control input and a current output and being configured to: receive the sequence of test pulses at the control input; and source or sink a current at the current output during each of the test pulses; a second capacitor, connected to the current output of the first charge pump and configured to be charged to a test voltage during each of the test pulses; and a feedback circuit, connected to the pulse width control input of the first pulse generator, configured to adjust the duration of the test pulses in a direction to reduce a difference between the reference voltage and the test voltage.

In one embodiment, the system includes a reset circuit configured to: charge or discharge the first capacitor to a starting voltage before the beginning of each of the reference pulses; and charge or discharge the second capacitor to the starting voltage before the beginning of each of the test pulses.

In one embodiment, the feedback circuit includes a differential amplifier having a first input connected to the first capacitor and a second input connected to the second capacitor.

In one embodiment, the feedback circuit further includes an integrator connected to the output of the differential amplifier, and to the pulse width control input of the first pulse generator.

In one embodiment, the integrator includes a capacitor, and the pulse width control input of the first pulse generator is an analog input.

In one embodiment, the integrator includes an up-down counter, and the pulse width control input of the first pulse generator is a digital input.

In one embodiment, the system includes a second pulse generator, the second pulse generator having a pulse width control input, the feedback circuit being further connected to the pulse width control input of the second pulse generator.

In one embodiment, the second pulse generator is configured to generate a sequence of slave pulses each having a width equal to a multiple of a width of a corresponding test pulse of the sequence of test pulses.

In one embodiment, the first pulse generator includes: a circuit configured to generate a delay control signal; and a first controllable delay element configured to incur a controllable delay controlled by the delay control signal, and the first pulse generator is configured to generate the sequence of test pulses with each test pulse having a pulse width equal to a length of the controllable delay.

In one embodiment, the system includes a second controllable delay element configured to incur a delay controlled by the delay control signal.

In one embodiment, the second controllable delay element is configured to incur a delay equal to a multiple of a delay incurred by the first controllable delay element.

In one embodiment, a capacitance of the first capacitor is the same as a capacitance of the second capacitor.

In one embodiment, a capacitance of one or more of the first capacitor and the second capacitor is adjustable during operation.

According to an embodiment of the present invention there is provided a method for calibrating, the method including: charging a first capacitor to a reference voltage, with a current of a first charge pump, during a reference pulse; charging a second capacitor to a test voltage with a current of a second charge pump, during a first test pulse; and generating a second test pulse, the second test pulse being shorter than the first test pulse, when a shorter test pulse will reduce the difference between the test voltage and the reference voltage, and the second test pulse being longer than the first test pulse, when a longer test pulse will reduce the difference between the test voltage and the reference voltage.

In one embodiment, the method includes: before the beginning of the reference pulse, charging or discharging the first capacitor to a starting voltage, and before the beginning of the first test pulse, charging or discharging the second capacitor to the starting voltage._

In one embodiment, the method includes: after the end of the reference pulse and the end of the first test pulse, comparing the test voltage and the reference voltage with a differential amplifier.

In one embodiment, a capacitance of the first capacitor is the same as a capacitance of the second capacitor.

In one embodiment, a capacitance of one or more of the first capacitor and the second capacitor is adjustable during operation.

In one embodiment, the method includes generating a slave pulse having a width equal to a multiple of a width of the second test pulse.

In one embodiment, the slave pulse has a width equal to a width of the test pulse.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a technique for calibrating pulse width and delay provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the present disclosure. As denoted elsewhere herein, like element numbers are intended to indicate like elements or features.

Figure 1:
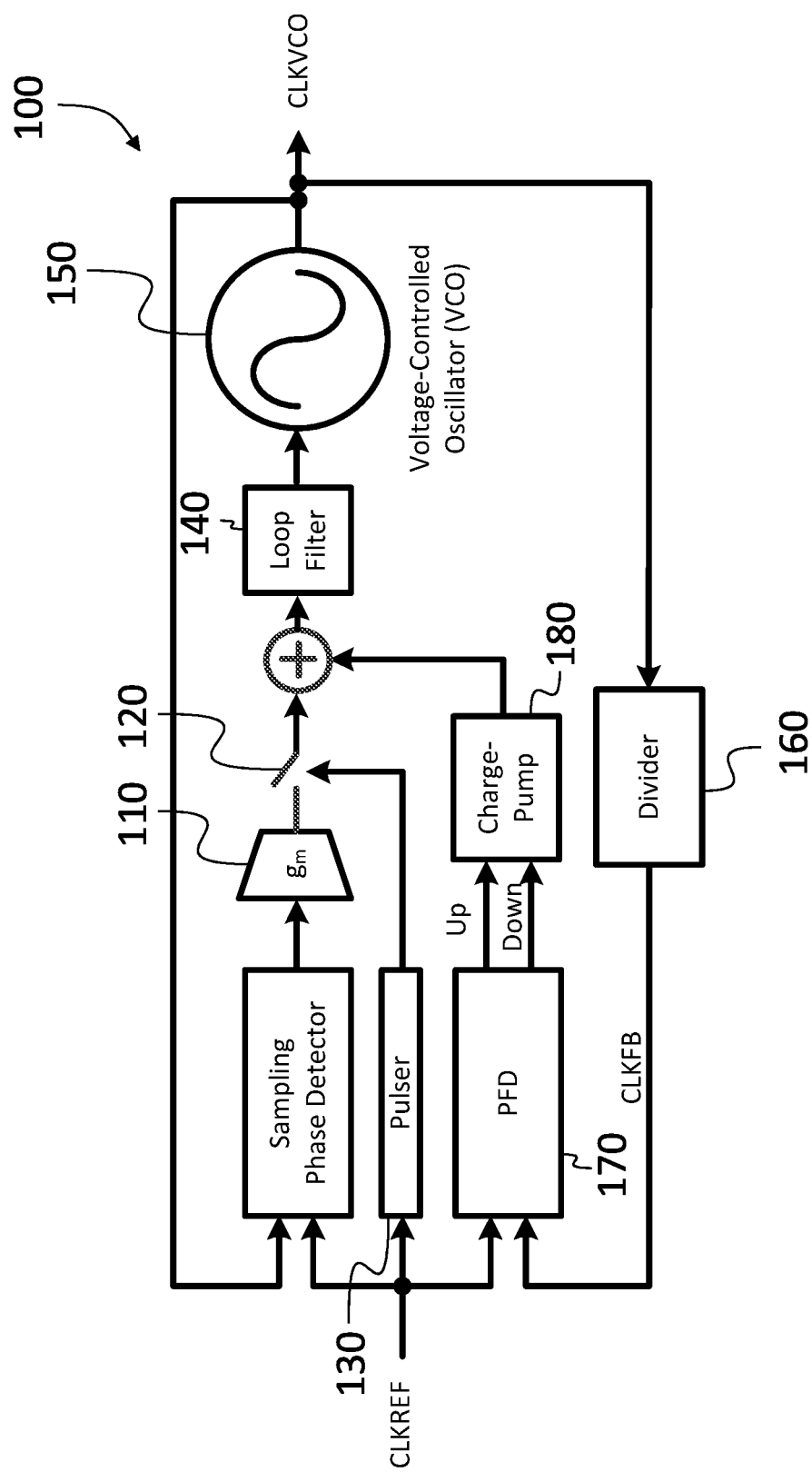
FIG. 1 is a block diagram of a sub-sampling phase locked loop, according to an embodiment of the present disclosure.

FIG. 1 is a block diagram of a sub-sampling phase locked loop, according to an embodiment of the present disclosure. A sub-sampling phase locked loop 100 includes a voltage controlled current source 110 followed by a switch 120, the switch 120 being controlled by a pulser 130. The switch 120 is closed only during each pulse from the pulser 130; this reduces the effective transconductance of the voltage controlled current source 110, reducing the gain of the feedback loop of the phase locked loop. The phase locked loop 100 further includes a loop filter 140, a voltage controlled oscillator (VCO) 150 connected to the output of the loop filter 140, a divider 160 connected to the output of the voltage controlled oscillator (VCO) 150, a phase and frequency detector 170 that receives signals from the divider 160 and from an external reference clock, and a charge pump 180. The gain factor of the pulser 130 may be proportional to the pulse width (i.e., the duration of the pulse) that the pulser 130 generates. In the absence of measures to calibrate the pulse width of the pulser 130, the pulse width may vary significantly, e.g., in the range from −17% of nominal to +19% of nominal, as a result of temperature, supply voltage, and process variations. This variation may result in poor performance and/or instability in the phase locked loop 100.

Figure 2:
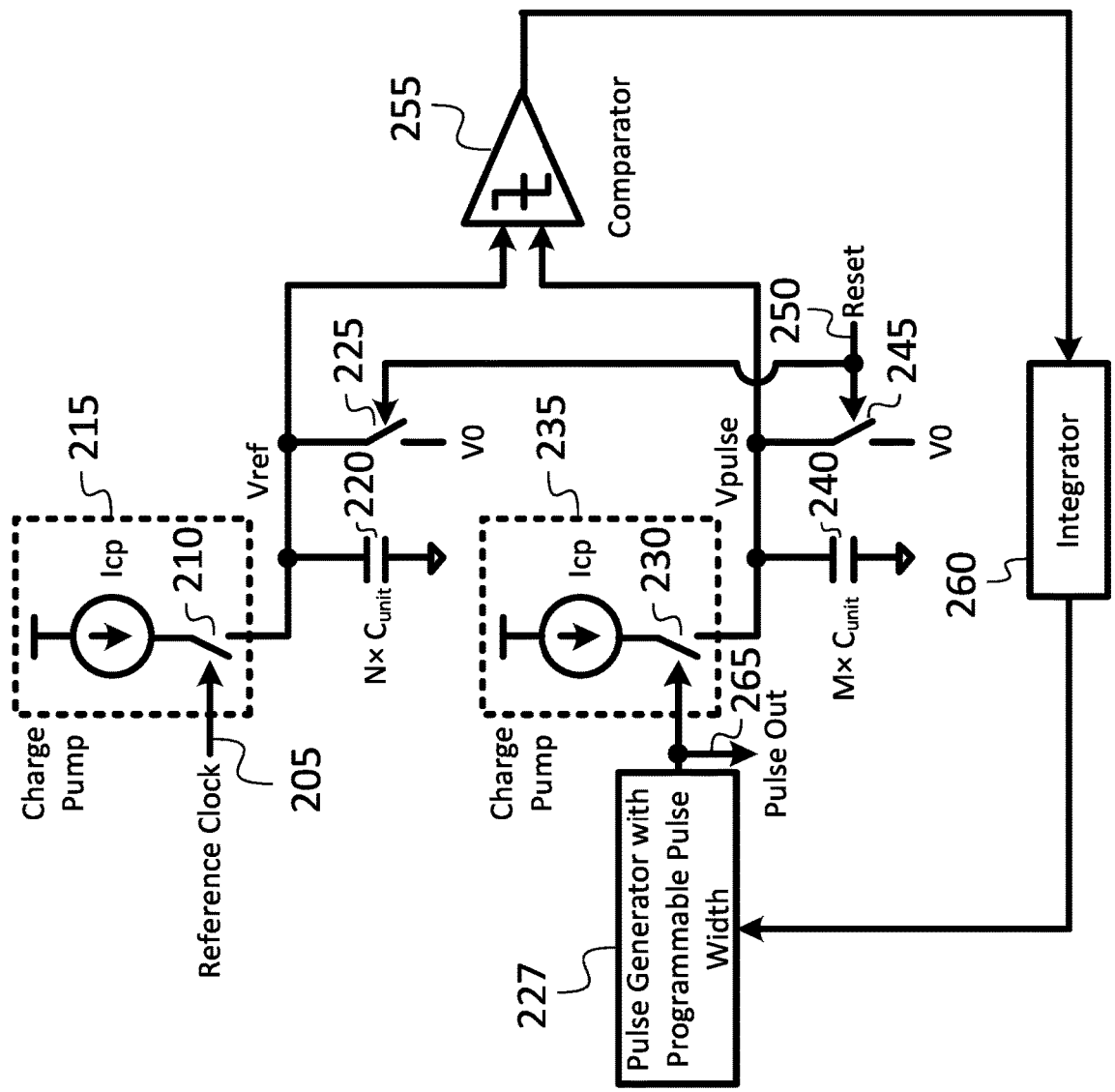
FIG. 2 is a hybrid schematic block diagram of a circuit for generating pulses with calibrated pulse widths, according to an embodiment of the present disclosure.

FIG. 2 is a hybrid schematic block diagram of a circuit for generating pulses with calibrated pulse widths, according to an embodiment of the present disclosure. A reference clock signal 205 includes a sequence of pulses of known or controlled widths. The reference clock signal 205 controls a switch 210 within a first charge pump 215. When the switch 210 is closed, the first charge pump 215 charges a first capacitor 220, having a capacitance equal to N×$C_{unit}$, where N is a positive number (e.g., a positive integer) and $C_{unit}$ is a unit capacitance value that may be related to the resolution of the process (e.g., the integrated circuit fabrication process) used to fabricate the capacitor, or that may be arbitrary.

As used herein, a "charge pump" is a current source or current sink that has a control input for enabling (i.e., turning on) or disabling (i.e., turning off) the current source or current sink. The current source or current sink may be implemented, for example, as a current mirror, having a current reference arm (including a current reference transistor) and a mirror arm (including a mirror transistor connected to the current reference arm by a control connection). The current through the current reference transistor may control the mirrored current, which is the output current of the charge pump. The switch of the charge pump may be implemented as a switching transistor, connected in series with the mirror transistor (as in the embodiment illustrated in FIG. 2), or connected to the control connection and configured, when turned on, to turn off the mirror transistor (by pulling the control connection up or down). The transistors of the current mirror and the switching transistor may be field effect transistors (e.g., metal oxide semiconductor field effect transistors (MOSFETs), e.g., in a complementary metal oxide semiconductor (CMOS) integrated circuit).

Referring to FIG. 2, the first capacitor 220 may be connected through a first reset switch 225 to a voltage V0 (referred to herein as a "starting" voltage). Before the beginning of each pulse in the reference clock signal 205, the first reset switch 225 may be closed, resetting the voltage on the first capacitor 220 to V0. Before the beginning of a pulse in the reference clock signal 205, the first reset switch 225 is opened. During the pulse in the reference clock signal 205, the switch 210 is closed and the first charge pump 215 supplies a current Icp to the first capacitor 220. At the end of the pulse in the reference clock signal 205, the voltage V1 (referred to herein as the "reference voltage") on the first capacitor 220 is therefore $V1=(Icp \times Tref)/(N \times C_{unit})+V0$, where Tref is the duration of the pulse in the reference clock signal 205.

In another part of the circuit, a pulse generator 227 generates a signal that includes a sequence of pulses. The duration of the pulses generated by the pulse generator 227 is controlled by a signal provided to a pulse width control input of the pulse generator 227. The pulse generator signal controls a switch 230 within a second charge pump 235. When the switch 230 is closed, the second charge pump 235 charges a second capacitor 240, having a capacitance equal to $M \times C_{unit}$, where M is a positive number (e.g., a positive integer). The second capacitor 240 may be connected through a second reset switch 245 to the starting voltage V0. Before the beginning of each pulse in the signal from the pulse generator 227, the second reset switch 245 may be closed, resetting the voltage on the second capacitor 240 to the starting voltage V0. The first reset switch 225 and the second reset switch 245 are controlled by a common reset signal 250.

Before the beginning of a pulse in the signal from the pulse generator 227, the second reset switch 245 is opened. During the pulse in the signal from the pulse generator 227, the switch 230 is closed and the second charge pump 235 supplies a current Icp to the second capacitor 240. At the end of the pulse in the signal from the pulse generator 227, the voltage V2 (referred to herein as the "test voltage") on the second capacitor 240 is therefore $V2=(Icp \times Tpulse)/(M \times C_{unit})+V0$, where Tpulse is the duration of the pulse in the signal from the pulse generator 227. When V1=V2, the duration Tpulse of the pulse in the signal from the pulse generator 227 is equal to M/N times the duration Tref of the pulse in the reference clock signal 205. Accordingly, a feedback circuit, that adjusts the duration Tpulse of the pulses in the signal from the pulse generator 227 (which may be referred to herein as "test pulses") so that V1=V2, may be used to control the duration Tpulse of the test pulses. Such a feedback circuit may be constructed, for example, of a differential amplifier, e.g., a comparator 255, that forms an error signal, that is fed back through the integrator 260, to the pulse width control input of the pulse generator 227. The output of the pulse generator 227 may also act as the output 265 of the circuit.

The circuit of FIG. 2 may produce pulses with widths having relatively little variation over temperature, supply voltage, and process variations, in part because (i) the ratio of the respective capacitances of the first capacitor 220 and the second capacitor 240 may vary little with temperature, supply voltage, and process variations and (ii) the ratio of the respective currents produced by the first charge pump 215 and the second charge pump 235 may also vary little with temperature, supply voltage, and process variations. Although the respective currents of each of the first charge pump 215 and the second charge pump 235 may vary significantly with temperature, supply voltage, and process variations, the two currents may vary in substantially the same way, so that the ratio of the two currents is substantially fixed. Further, the second charge pump 235 may include a current source that is an additional mirror arm of the same current mirror used in the first charge pump 215, further reducing mechanisms by which differential variations could otherwise occur.

Each of the first capacitor 220 and the second capacitor 240 may be a simple, fixed capacitor, e.g., a capacitor including two parallel conductive surfaces separated by a thin insulating layer. In some embodiments, at least one of the first capacitor 220 and the second capacitor 240 is programmable (or "adjustable during operation"), i.e., capable of being adjusted during operation. For example, a programmable capacitor may be a composite capacitor including a plurality of simple capacitors connected (e.g., in parallel) by switches (e.g., by transistor switches). A programmable capacitor having a first terminal and a second terminal may be formed as a sequence of fixed capacitors, each having one terminal connected to the first terminal of the programmable capacitor and another terminal connected through a transistor switch to the second terminal of the programmable capacitor. The capacitance of the programmable capacitor is then equal to the total of the respective capacitances of all of the simple capacitors for which the transistor switches are closed (i.e., conducting) (these simple capacitors all being connected in parallel as a result of their respective switches being closed). In some embodiments the simple capacitors of a programmable capacitor of this kind have respective capacitances each of which, except the smallest, is greater by a factor of two than the next-smaller capacitance.

Figure 3:
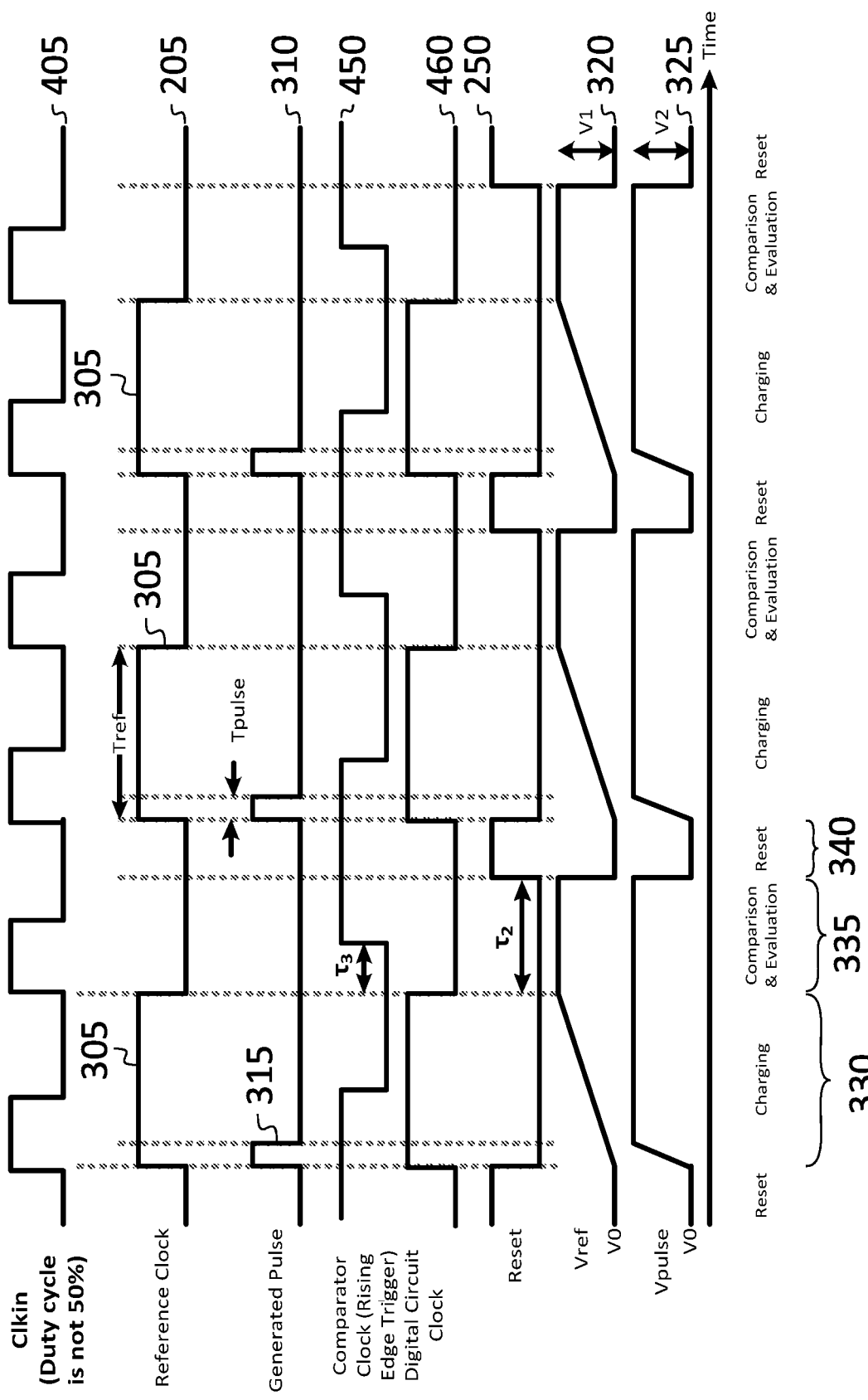
FIG. 3 is a timing diagram for a circuit for generating pulses with calibrated pulse widths, according to an embodiment of the present disclosure.

FIG. 3 is a timing diagram for a circuit for generating pulses with calibrated pulse widths, according to an embodiment of the present disclosure. FIG. 3 shows the timing of several of the signals in the circuit of FIG. 2. The reference clock signal includes a sequence of reference pulses 305, each having a duration Tref. The signal 310 from the pulse generator 227 includes a plurality of test pulses 315, each having a width approximately equal to Tpulse. The rising edges of the reference pulses 305 and of the test pulses 315 may be synchronized to have simultaneous rising edges, as shown, and as discussed in further detail below. Before each simultaneous rising edge of a reference pulse 305 and a test pulse 315, a pulse in the reset signal 250 resets both the first capacitor 220 and the second capacitor 240 to a voltage of V0. During each of the reference pulses 305, the voltage 320 across the first capacitor 220 (which may be referred to as Vref) increases at constant rate equal to $Icp/(N \times C_{unit})$, and during each of the test pulses 315, the voltage 325 across the second capacitor 240 (which may be referred to as Vpulse) increases at constant rate equal to $Icp/(M \times C_{unit})$.

Each cycle of the system includes a charging phase 330 during which the first capacitor 220 is charged, and during part of which the second capacitor 240 is charged, a comparison and evaluation phase 335, and a reset phase 340, during which the first reset switch 225 and the second reset switch 245 are both closed, and each of the first capacitor 220 and the second capacitor 240 is reset to the starting voltage V0. During the comparison and evaluation phase 335, V1 is compared to V2, and the feedback circuit increases the width of the test pulses 315 if V1>V2 and decreases the width of the test pulses 315 if V1<V2. Although in this example the reference clock duty cycle is illustrated as being 50%, and the test pulses are illustrated as being shorter than the reference pulses, it will be understood that in other embodiments the reference clock duty cycle may be greater or less than 50%, and the test pulses may be longer than the reference pulses.

Figure 4:
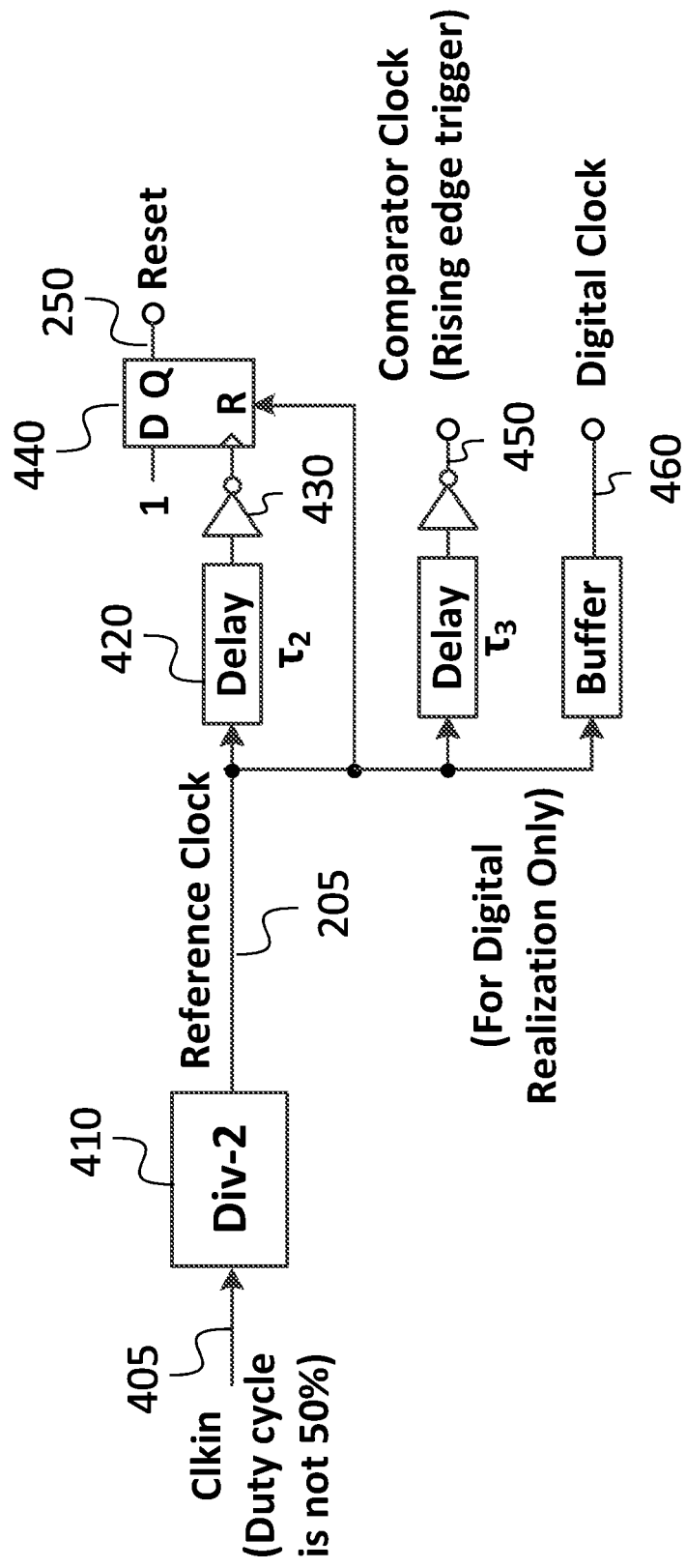
FIG. 4 is a hybrid schematic block diagram of a circuit for generating clock and control signals, according to an embodiment of the present disclosure.

FIG. 4 is a hybrid schematic block diagram of a circuit for generating clock and control signals, according to an embodiment of the present disclosure. In some embodiments the reference clock signal 205 and the reset signal 250 are generated by the circuit of FIG. 4. An input clock signal 405 (which may have a duty cycle different from 50%) at twice the frequency of the reference clock signal 205 is divided by two, by a divider 410 that generates an output with a 50% duty cycle, regardless of the duty cycle of the input clock signal. A reference pulse delay block 420 delays the reference clock signal 205, and the delayed signal is inverted by an inverter 430 and fed to the clock input of a D flip-flop 440. The reference clock signal 205 is also fed to the reset input of the D flip-flop 440. As a result, the rising edge of each of the pulses in the reset signal 250 follows a falling edge of the reference clock signal 205 by the amount of delay incurred by the combination of the reference pulse delay block 420 and the inverter 430. The circuit may also be used to produce a comparator clock signal 450 and a digital circuit clock signal 460, the use of which is described in further detail below.

Figure 5:
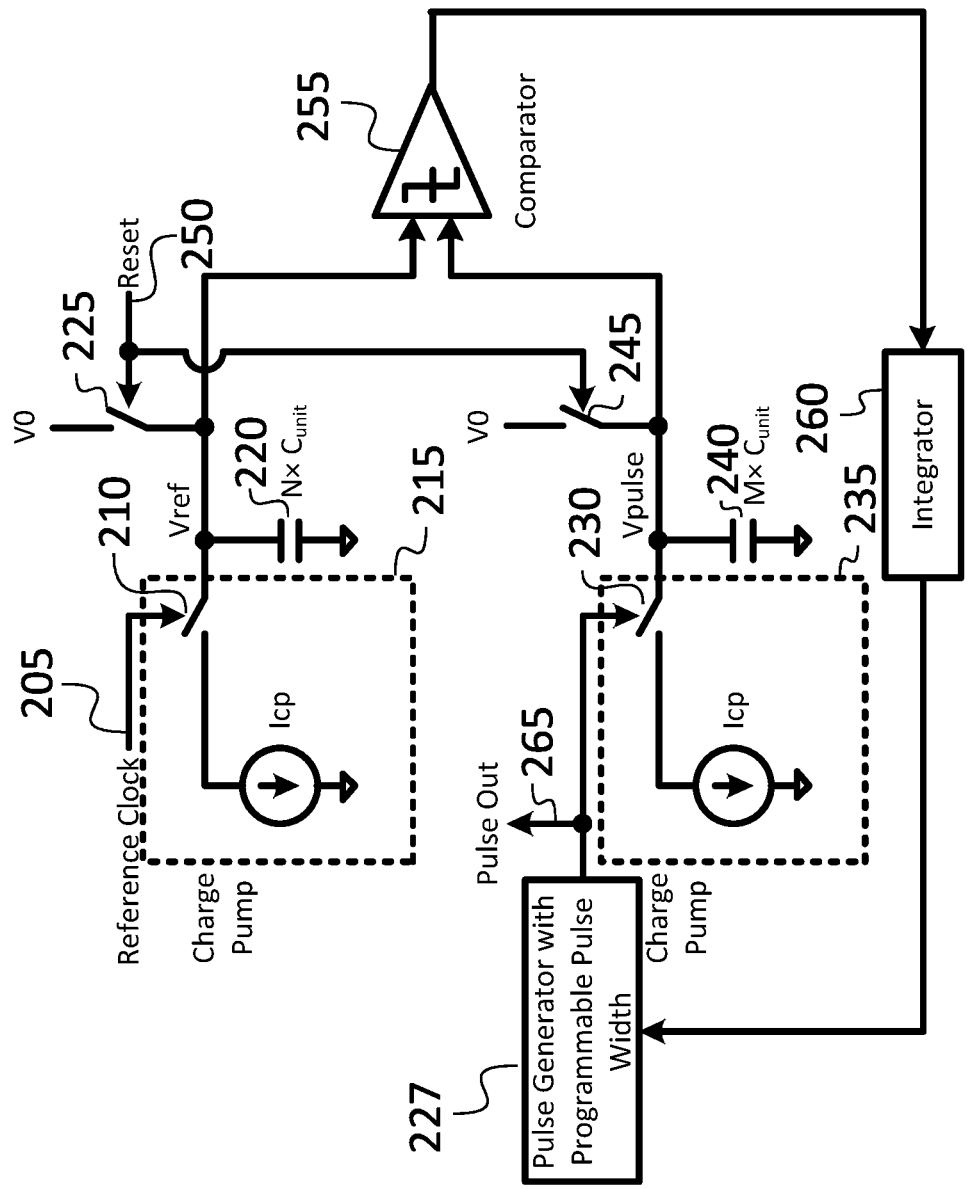
FIG. 5 is a hybrid schematic block diagram of a circuit for generating pulses with calibrated pulse widths, according to an embodiment of the present disclosure.

It will be understood that variants of the above-described embodiments may operate in analogous fashion. FIG. 5 is a hybrid schematic block diagram of a circuit for generating pulses with calibrated pulse widths, according to an embodiment of the present disclosure. Each of the first charge pump 215 and the second charge pump 235 may include a current sink instead of a current source.

Figure 6:
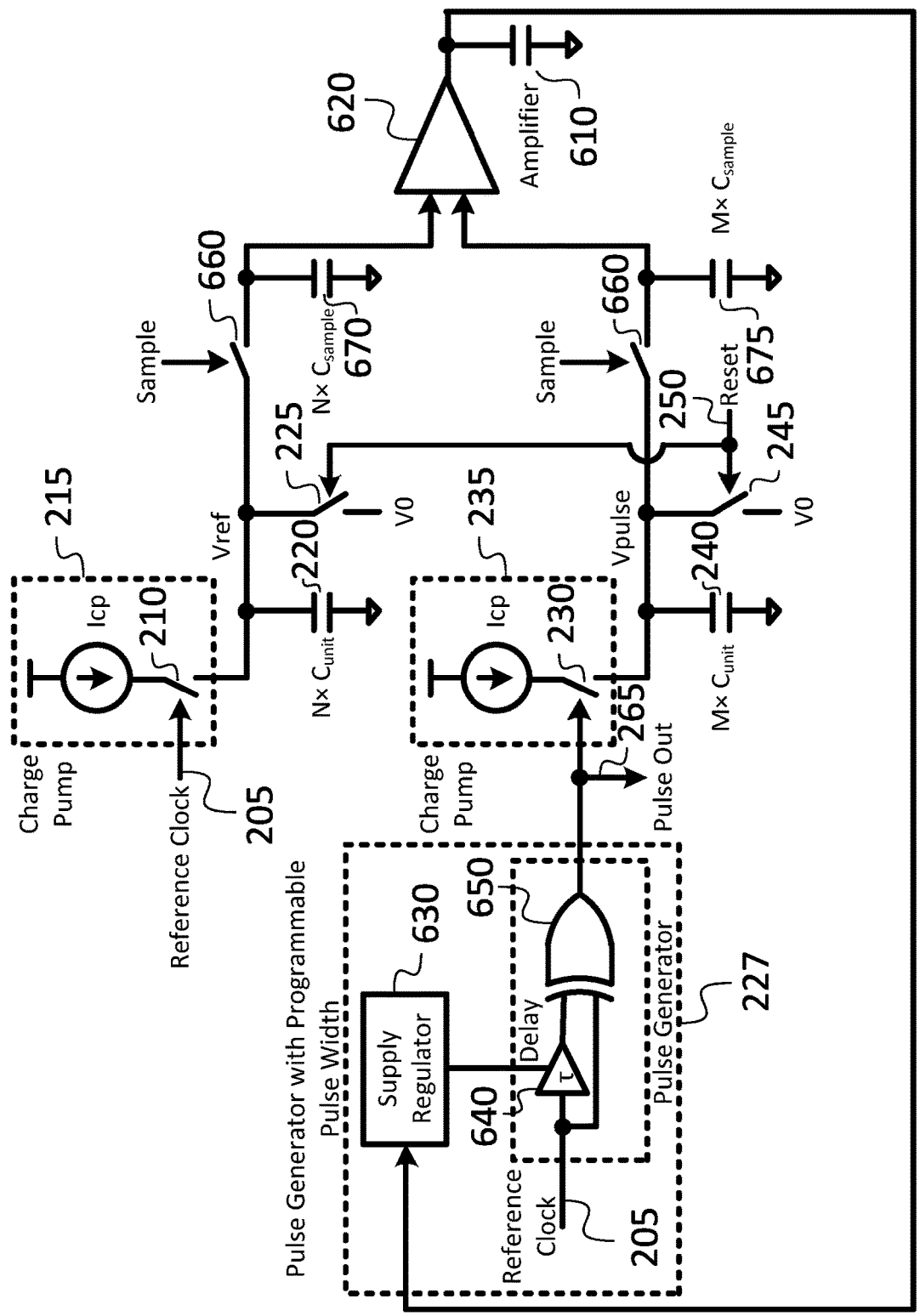
FIG. 6 is a hybrid schematic block diagram of a circuit for generating pulses with calibrated pulse widths, according to an embodiment of the present disclosure.

FIG. 6 is a hybrid schematic block diagram of a circuit for generating pulses with calibrated pulse widths, according to an embodiment of the present disclosure. The feedback circuit may be implemented as an analog circuit. Such a feedback circuit may be implemented by a capacitor 610 loading the output of the error amplifier 620. As a result of the finite output impedance of the error amplifier 620 (or an external series resistor that may be added), the voltage across the integrator capacitor 610 increases at a rate proportional to the loop error, i.e., proportional to the difference V1−V2. This integrated error signal is then fed, as an analog signal, to the pulse width control input of the pulse generator 227. The pulse generator 227 may include a supply regulator 630 connected to a voltage-controlled delay element 640, that is configured with an exclusive OR gate 650 to generate a pulse, immediately following each rising edge in the reference clock signal 205, the pulse having a width equal to the amount of delay incurred in the voltage-controlled delay element 640. A sample and hold function may be provided for each of the reference voltage and the test voltage by sampling switches 660 and first and second sampling capacitors 670 and 675 respectively that have capacitances in the same ratio as the first and second capacitors 220 and 240 respectively.

Figure 7A:
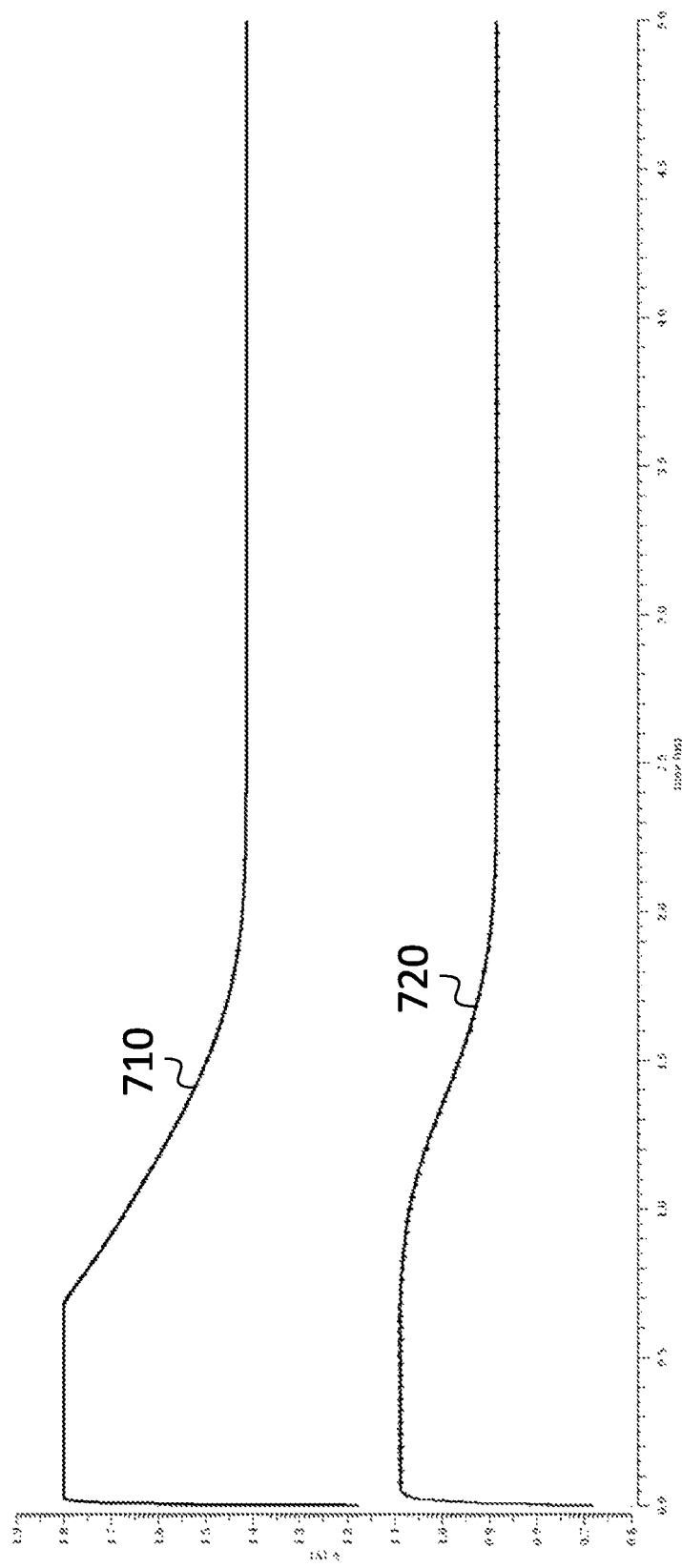
FIG. 7A is a graph of two signals as a function of time, according to an embodiment of the present disclosure.

FIG. 7A is a graph of two signals as a function of time, according to an embodiment of the present disclosure. FIG. 7A shows the behavior, in a simulation of the circuit of FIG. 6, of the voltage (shown in a first curve 710) at the output of the error amplifier 620, and of the voltage (shown in a second curve 720) at the output of the supply regulator 630.

Figure 7B:
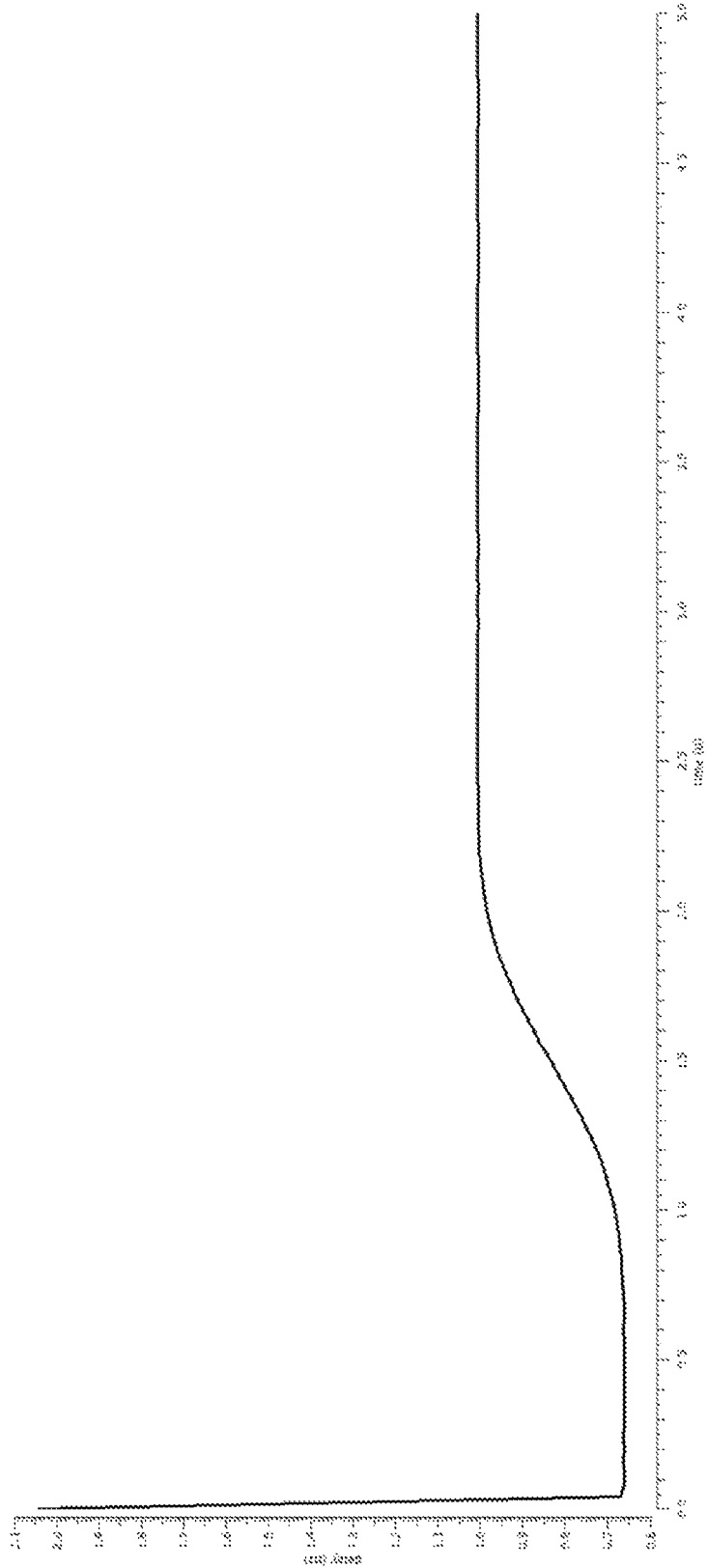
FIG. 7B is a graph of one signal as a function of time, according to an embodiment of the present disclosure.

FIG. 7B is a graph of one signal as a function of time, according to an embodiment of the present disclosure. FIG. 7B shows, for the same simulation, the pulse width as a function of time. It can be seen that the pulse width converges, after a startup transient, to a steady state value, which, in this simulation, is 1 ns.

Figure 8:
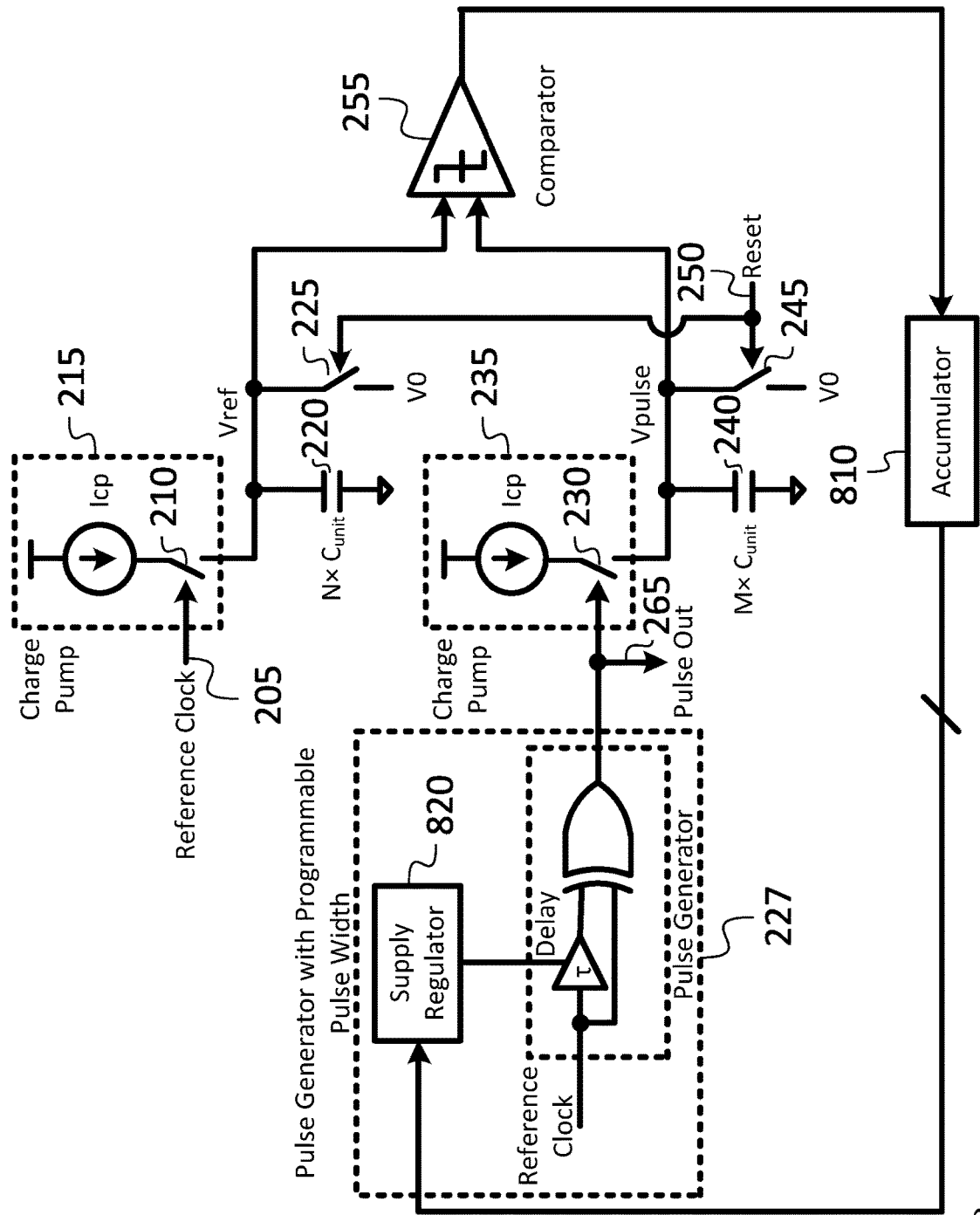
FIG. 8 is a hybrid schematic block diagram of a circuit for generating pulses with calibrated pulse widths, according to an embodiment of the present disclosure.

FIG. 8 is a hybrid schematic block diagram of a circuit for generating pulses with calibrated pulse widths, according to an embodiment of the present disclosure. The feedback circuit may be implemented as a digital circuit. Such a feedback circuit may be implemented by an accumulator 810, that may be a synchronous up-down counter that increments by one count when its input is binary 1 (e.g., a positive voltage, received from the comparator 255) and decrements when its input is binary 0 (e.g., a negative voltage, received from the comparator 255). The comparator 255 is a clocked comparator, the clock input of which is fed by a signal such as the comparator clock signal 450 (FIGS. 3 and 4) that has an edge (e.g., a rising edge) that triggers the comparator 255 within the comparison and evaluation phase 335. The other synchronous logic of the circuit (such as the accumulator 810) may be clocked by the digital circuit clock signal 460 (FIGS. 3 and 4). The pulse width control input of the pulse generator 227 is a digital input (e.g., a parallel digital input) which is connected, in the pulse generator 227, to a digitally controlled supply regulator 820, which, as in the embodiment of FIG. 6, controls the delay of a voltage-controlled delay element 640, thereby controlling the widths of the test pulses produced by the pulse generator 227. In this embodiment, the digitally controlled supply regulator 820 may include a digital to analog converter. In a digital circuit such as that of FIG. 8, it may be possible to shut down most or all of the circuit components except the pulse generator 227 (which includes the supply regulator 820) once the loop has settled, preserving the final value of the setting of the digitally controlled supply regulator 820 in a suitable register (e.g., a register in the digitally controlled supply regulator 820, or in the accumulator 810, by disabling the clock input of the accumulator). The system may remain in this low-power state until system power is cycled or the system is otherwise reset, or until the temperature changes by more than a threshold amount.

Figure 9:
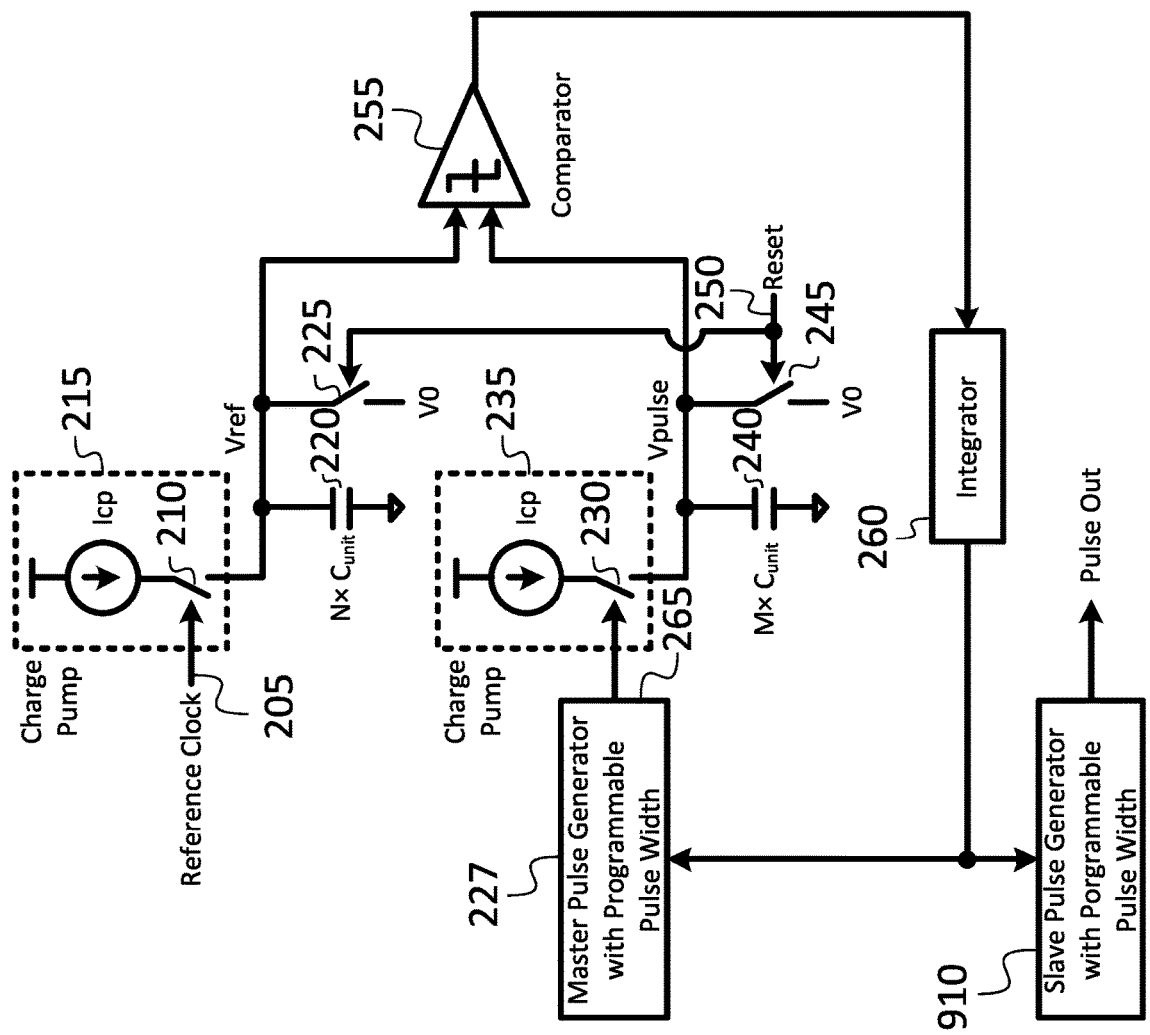
FIG. 9 is a hybrid schematic block diagram of a circuit for generating pulses with calibrated pulse widths, according to an embodiment of the present disclosure.

FIG. 9 is a hybrid schematic block diagram of a circuit for generating pulses with calibrated pulse widths, according to an embodiment of the present disclosure. The pulse generator 227 may act as a master pulse generator, and a slave pulse generator 910 may receive the same control signal (e.g., the same analog or digital control signal) and accordingly may generate a sequence of pulses of substantially the same width as those generated by the master pulse generator 227. In some embodiments, the slave pulse generator 910 generates pulses of a width that is different from (and proportional to) those generated by the master pulse generator 227. This may be the case, for example, if the delay incurred in a voltage-controlled delay element in the slave pulse generator 910 differs, at the same control voltage, from that of the voltage-controlled delay element in the master pulse generator 227. This may, in turn, be the case if each of the respective voltage-controlled delay element consists of either (i) a single voltage-controlled delay component or (ii) a cascade of one or more of the same voltage-controlled delay components, with the number of cascaded voltage-controlled delay components in the slave pulse generator 910 being different (e.g., greater than or less than) the number of cascaded voltage-controlled delay components in the master pulse generator 227.

The use of a slave pulse generator 910 may also make it possible to adjust the pulse width dynamically, at the output of the slave pulse generator 910, without the delay in response that may occur if the dynamic change is made by changing the value of the first capacitor 220 or of the second capacitor 240. For example, the number of cascaded voltage-controlled delay components in the slave pulse generator 910 may be changed dynamically by opening or closing a switch (e.g., a transistor switch) connected between the output of a first voltage-controlled delay component in the cascade and the input of a second voltage-controlled delay component in the cascade, there being one or more intervening voltage-controlled delay components between the first voltage-controlled delay component and the second voltage-controlled delay component, the closing of the switch having the effect of bypassing the intervening voltage-controlled delay components and shortening the total delay accordingly. In such an embodiment, the programmability of the delay element in the slave pulse generator 910 may make it possible to provide, for example, a programmable 1×, 2×, or 3× pulse width relative to the master pulse generator 227.

Figure 10:
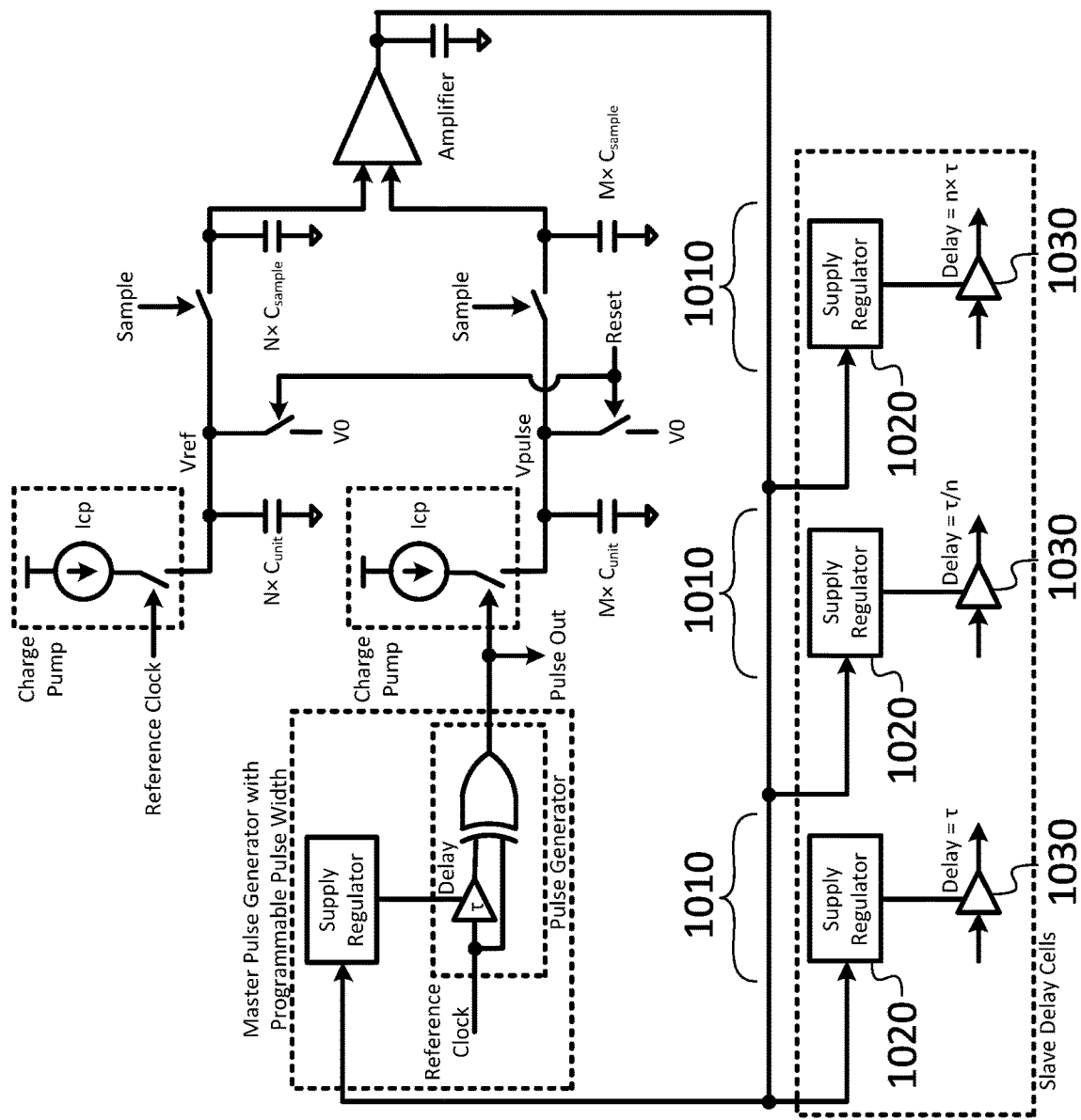
FIG. 10 is a hybrid schematic block diagram of a circuit for producing calibrated delays, according to an embodiment of the present disclosure.

FIG. 10 is a hybrid schematic block diagram of a circuit for producing calibrated delays, according to an embodiment of the present disclosure. The circuit of FIG. 6 may be modified to provide one or more calibrated delay cells 1010. Each of the calibrated delay cells 1010 is a slave unit, including a supply regulator 1020 that receives the same control signal that is fed to the pulse width control input of the pulse generator 227, and a voltage-controlled delay element 1030. Accordingly, each of the slave delay elements may incur the same delay as the voltage-controlled delay element in the pulse generator 227, or, in a manner analogous to that of the embodiment of FIG. 9, a greater or smaller delay, if the delay element of the calibrated delay cells 1010 is constructed to be different from that of the pulse generator 227.

Figure 11:
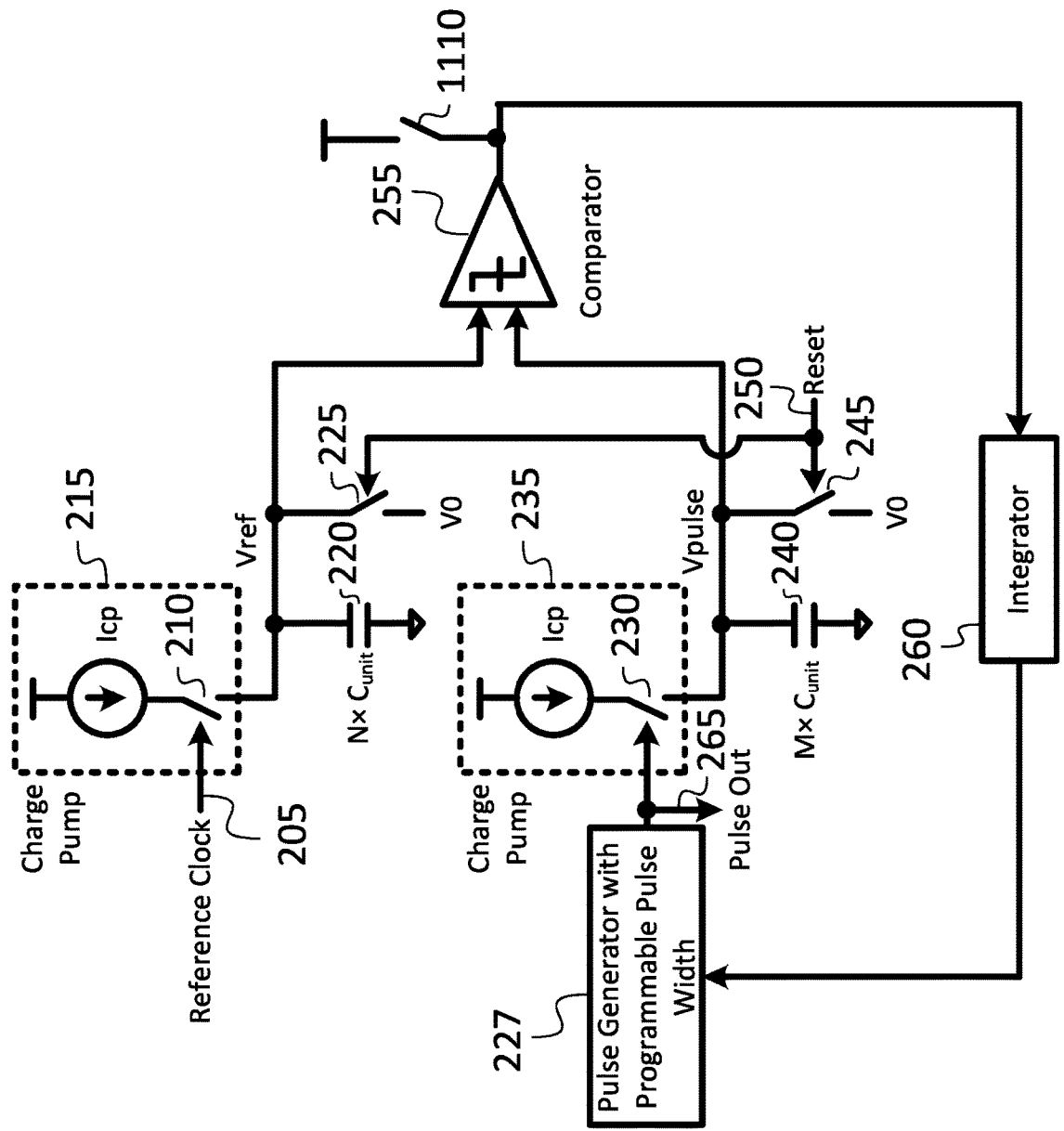
FIG. 11 is a hybrid schematic block diagram of a circuit for generating pulses with calibrated pulse widths, according to an embodiment of the present disclosure.

FIG. 11 is a hybrid schematic block diagram of a circuit for generating pulses with calibrated pulse widths, according to an embodiment of the present disclosure. The present circuit may produce a calibrated pulse width or delay that is initialized at startup. During operation, a higher supply voltage from the supply regulator may generally result in a shorter pulse from the pulse generator 227, and a lower supply voltage from the supply regulator may result in a longer pulse from the pulse generator 227. However, when the supply from the supply regulator is below a minimum operating voltage, the pulse generator 227 may generate no pulses, which may be equivalent, with respect to the operation of the remainder of the circuit, to generating pulses with zero pulse width. As such, if at startup the supply voltage from the supply regulator is sufficiently low that no pulses are generated, the feedback circuit may further lower the supply voltage from the supply regulator, in order to increase the pulse width, and the loop may transition to an inoperative state in which the voltage from the supply regulator remains at the lowest achievable value. To avoid this result, the node at the output of the comparator 255 or of the error amplifier 620 (FIG. 6) may be pulled up (e.g., by a switch 1110, e.g., a transistor having an on resistance comparable to or smaller than the output impedance of the comparator 255 or of the error amplifier 620), at startup, to a relatively high voltage.

Circuits of embodiments of the present disclosure may be constructed in an integrated circuit, e.g., in a complementary metal oxide semiconductor (CMOS) integrated circuit. The unit capacitance value may be about 45 femtoFarads (fF), and the transistors may be MOSFETs.

In view of the foregoing, some embodiments provide a system and method for calibrating a duration of a pulse or a delay. A reference clock signal includes a sequence of reference pulses, and controls a switch in a first charge pump that is configured to charge a first capacitor. Each of a sequence of test pulses controls a switch in a second charge pump that is configured to charge a second capacitor. At the end of each charging cycle, the respective capacitor voltages are compared and the duration of the test pulses is adjusted, by a feedback circuit, in a direction tending to make the capacitor voltages equal. When the capacitor voltages are equal, the ratio of the lengths of the reference pulses and test pulses equals the ratio of the capacitances, if the charge pumps deliver the same current when switched on.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a technique for calibrating pulse width and delay have been specifically described and illustrated herein, many modifications and variations will be apparent to those skilled in the art. Accordingly, it is to be understood that a technique for calibrating pulse width and delay constructed according to principles of the present disclosure may be embodied other than as specifically described herein. The present disclosure is also defined in the following claims, and equivalents thereof.

What is claimed is:

1. A system for calibrating, the system comprising:
a first charge pump having a control input and a current output and being configured to:
  receive a sequence of reference pulses at the control input; and
  source or sink a current at the current output during each of the reference pulses;
a first capacitor, connected to the current output of the first charge pump and configured to be charged to a reference voltage during each of the reference pulses;
a first pulse generator having a pulse width control input, and being configured to generate a sequence of test pulses, each of the test pulses having a duration controlled by a signal received at the pulse width control input;
a second charge pump having a control input and a current output and being configured to:
  receive the sequence of test pulses at the control input; and
  source or sink a current at the current output during each of the test pulses;
a second capacitor, connected to the current output of the second charge pump and configured to be charged to a test voltage during each of the test pulses; and
a feedback circuit, connected to the pulse width control input of the first pulse generator, configured to adjust, based on the test voltage and on the reference voltage, the duration of the test pulses in a direction to reduce a difference between the reference voltage and the test voltage.

2. The system of claim 1, further comprising a reset circuit configured to:
charge or discharge the first capacitor to a starting voltage before the beginning of each of the reference pulses; and
charge or discharge the second capacitor to the starting voltage before the beginning of each of the test pulses.

3. The system of claim 1, wherein the feedback circuit comprises a differential amplifier having a first input connected to the first capacitor and a second input connected to the second capacitor.

4. The system of claim 3, wherein the feedback circuit further comprises an integrator connected to the output of the differential amplifier, and to the pulse width control input of the first pulse generator.

5. The system of claim 4, wherein the integrator comprises a capacitor, and the pulse width control input of the first pulse generator is an analog input.

6. The system of claim 4, wherein the integrator comprises an up-down counter, and the pulse width control input of the first pulse generator is a digital input.

7. The system of claim 1, further comprising a second pulse generator, the second pulse generator having a pulse width control input, the feedback circuit being further connected to the pulse width control input of the second pulse generator.

8. The system of claim 7, wherein the second pulse generator is configured to generate a sequence of slave pulses each having a width equal to a multiple of a width of a corresponding test pulse of the sequence of test pulses.

9. The system of claim 1, wherein:
the first pulse generator comprises:
  a circuit configured to generate a delay control signal; and
  a first controllable delay element configured to incur a controllable delay controlled by the delay control signal, and
the first pulse generator is configured to generate the sequence of test pulses with each test pulse having a pulse width equal to a length of the controllable delay.

10. The system of claim 9, further comprising a second controllable delay element configured to incur a delay controlled by the delay control signal.

11. The system of claim 10, wherein the second controllable delay element is configured to incur a delay equal to a multiple of a delay incurred by the first controllable delay element.

12. The system of claim 1, wherein a capacitance of the first capacitor is the same as a capacitance of the second capacitor.

13. The system of claim 1, wherein a capacitance of one or more of the first capacitor and the second capacitor is adjustable during operation.

14. A method for calibrating, the method comprising:
charging a first capacitor to a reference voltage, with a current of a first charge pump, during a reference pulse;
charging a second capacitor to a test voltage with a current of a second charge pump, during a first test pulse; and
generating a second test pulse, based on the test voltage and on the reference voltage,
the second test pulse being shorter than the first test pulse, when a shorter test pulse will reduce the difference between the test voltage and the reference voltage, and
the second test pulse being longer than the first test pulse, when a longer test pulse will reduce the difference between the test voltage and the reference voltage.

15. The method of claim 14, further comprising:
before the beginning of the reference pulse, charging or discharging the first capacitor to a starting voltage, and
before the beginning of the first test pulse, charging or discharging the second capacitor to the starting voltage.

16. The method of claim 14, further comprising:
after the end of the reference pulse and the end of the first test pulse, comparing the test voltage and the reference voltage with a differential amplifier.

17. The method of claim 14, wherein a capacitance of the first capacitor is the same as a capacitance of the second capacitor.

18. The method of claim 14, wherein a capacitance of one or more of the first capacitor and the second capacitor is adjustable during operation.

19. The method of claim 14, further comprising generating a slave pulse having a width equal to a multiple of a width of the second test pulse.

20. The method of claim 19, wherein the slave pulse has a width equal to a width of the test pulse.

* * * * *